(12) United States Patent
Kroeker et al.

(10) Patent No.: US 6,244,811 B1
(45) Date of Patent: Jun. 12, 2001

(54) ATMOSPHERIC WAFER TRANSFER MODULE WITH NEST FOR WAFER TRANSPORT ROBOT

(75) Inventors: Tony R. Kroeker, Georgetown; Larry Cook, Austin, both of TX (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 09/342,669

(22) Filed: Jun. 29, 1999

(51) Int. Cl.[7] ................................... B65G 49/07
(52) U.S. Cl. ...................... 414/217; 414/937; 414/939
(58) Field of Search ................................... 414/217, 939, 414/937

(56) References Cited

U.S. PATENT DOCUMENTS

| | | | |
|---|---|---|---|
| 3,789,875 | 2/1974 | McGee | 137/553 |
| 4,340,462 | 7/1982 | Koch | 204/298 |
| 4,355,937 | 10/1982 | Mack et al. | 414/217 |
| 4,483,654 | 11/1984 | Koch et al. | 414/744 |
| 4,593,915 | 6/1986 | Seger et al. | 277/12 |
| 4,715,764 | 12/1987 | Hutchinson | 414/217 |
| 4,715,921 | 12/1987 | Maher et al. | 156/345 |
| 4,721,282 | 1/1988 | Shawver et al. | 251/62 |
| 4,747,577 | 5/1988 | Dimock | 251/158 |
| 4,753,417 | 6/1988 | Madocks et al. | 251/158 |
| 4,795,299 | 1/1989 | Boys et al. | 414/217 |
| 4,804,086 | 2/1989 | Grohrock | 206/328 |
| 4,813,846 | * 3/1989 | Helms | 414/939 X |
| 4,917,556 | 4/1990 | Stark et al. | 414/217 |
| 5,002,255 | 3/1991 | Sawa et al. | 251/193 |
| 5,076,205 | 12/1991 | Vowles et al. | 118/719 |
| 5,100,276 | 3/1992 | Iwasaki et al. | 414/222 |
| 5,120,019 | 6/1992 | Davis, Jr. | 251/193 |
| 5,150,882 | 9/1992 | Kaneko | 251/193 |
| 5,217,501 | 6/1993 | Fuse et al. . | |
| 5,292,393 | 3/1994 | Maydan et al. | 156/345 |
| 5,383,338 | 1/1995 | Bowsky et al. | 62/125 |
| 5,435,683 | 7/1995 | Oosawa et al. . | |
| 5,562,800 | 10/1996 | Kawamura et al. | 156/643.1 |
| 5,667,197 | 9/1997 | Boyd et al. | 251/193 |
| 5,697,749 | 12/1997 | Iwabuchi et al. | 414/217 |
| 5,697,759 | * 12/1997 | Bacchi et al. | 414/217 X |
| 5,769,952 | 6/1998 | Komino | 118/733 |
| 5,902,088 | 5/1999 | Fairbairn et al. | 414/217 |
| 5,980,684 | * 11/1999 | Hori et al. | 156/345 |

FOREIGN PATENT DOCUMENTS

| | | | |
|---|---|---|---|
| WO 92/02950 | 2/1992 | (EP) | H01L/21/00 |
| 591085A1 | 6/1994 | (EP) | H01L/21/00 |
| 1093854 | 5/1984 | (IN) | F16K/3/18 |
| WO99/13504 | 3/1999 | (WO) . | |

* cited by examiner

Primary Examiner—Steven A. Bratlie
(74) Attorney, Agent, or Firm—Martine Penilla & Kim, LLP (57) ABSTRACT

A load lock wafer transfer face is provided at an acute angle with respect to a footprint dimension line, so the length of the footprint dimension line does not include the entire minimum length of the wafer transfer distance that must separate a robot from the wafer transfer face of a load lock. Two adjacent load locks provided for use with a robot have two load lock wafer transfer faces defining a nest, in that each such face is at an acute angle with respect to the footprint dimension line. A robot is mounted for rotation at a fixed location relative to wafer cassettes and to the nested load lock wafer transfer faces, avoiding use of a robot track to move transversely. Because the faces are at the acute angle, there is only a component of, and not the entire, minimum wafer transfer distance extending in the direction of the footprint dimension line. The robot is positioned at least partly in the nest formed by the adjacent load lock faces without requiring rotation of the base of the robot on a vertical axis at the same time as the arms of the robot are moved in an extend motion during wafer transfer into the load lock. The footprint of the modules may be substantially reduced, in that at least one dimension of the footprint is minimized, yet the robot may operate with only relatively simple extend motion to transfer the wafers into the load locks, avoiding more complex motions that include both transverse motion (i.e., on a linear track) and rotate motion.

15 Claims, 11 Drawing Sheets

ATMOSPHERIC WAFER TRANSFER MODULE WITH NEST FOR WAFER TRANSPORT ROBOT

BACKGROUND OF THE INVENTION

1. Field of the Invention

The present invention relates generally to transferring wafers among modules of semiconductor processing equipment, and more particularly to nesting certain modules of the equipment, and methods of implementing such nesting, to facilitate transfer of wafers among separate chambers of semiconductor processing equipment while reducing the area footprint occupied by the equipment.

2. Description of the Related Art

In the manufacture of semiconductor devices, process chambers are interfaced to permit transfer of wafers or substrates, for example, between the interfaced chambers. Such transfer is via transport modules that move the wafers, for example, through slots or ports that are provided in the adjacent walls of the interfaced chambers. For example, transport modules are generally used in conjunction with a variety of substrate processing modules, which may include semiconductor etching systems, material deposition systems, and flat panel display etching systems. Due to the growing demands for cleanliness and high processing precision, there has been a growing need to reduce the amount of human interaction during and between processing steps. This need has been partially met with the implementation of vacuum transport modules which operate as an intermediate handling apparatus (typically maintained at a reduced pressure, e.g., vacuum conditions). By way of example, a vacuum transport module may be physically located between one or more clean room storage facilities where substrates are stored, and multiple substrate processing modules where the substrates are actually processed, e.g., etched or have deposition performed thereon. In this manner, when a substrate is required for processing, a robot arm located within the transport module may be employed to retrieve a selected substrate from storage and place it into one of the multiple processing modules.

Figure 1A:
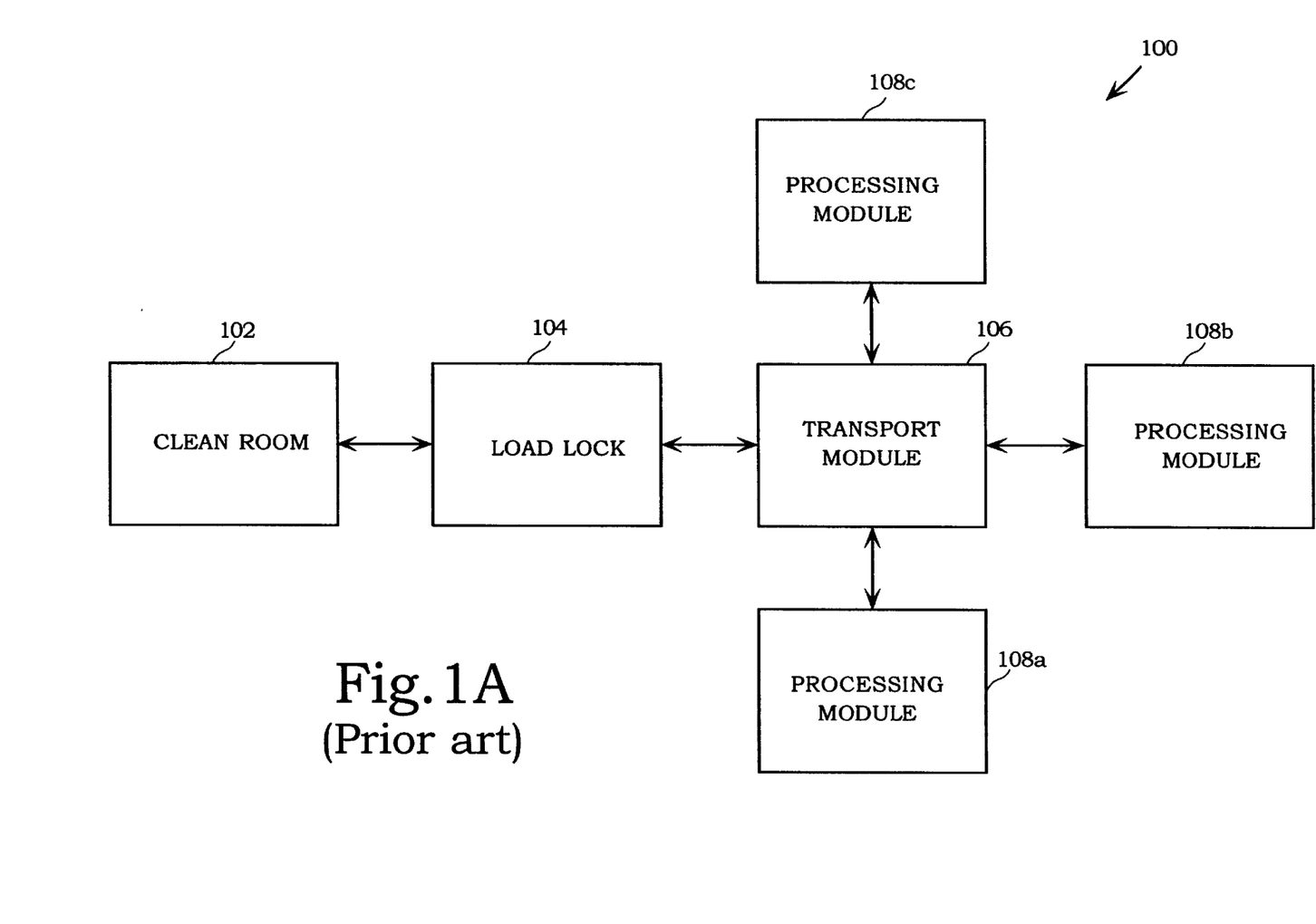
FIG. 1A depicts a typical prior art semiconductor process cluster tool architecture illustrating an atmospheric transfer module that interfaces with a vacuum transport module, wherein a load lock receives wafers for transfer to the vacuum transport module.

As is well known to those skilled in the art, the arrangement of transport modules to "transport" substrates among multiple storage facilities and processing modules is frequently referred to as a "cluster tool architecture" system. FIG. 1A depicts a typical semiconductor process cluster architecture 100 illustrating the various chambers that interface with a vacuum transport module 106. Vacuum transport module 106 is shown coupled to three processing modules 108a–108c which may be individually optimized to perform various fabrication processes. By way of example, processing modules 108a–108c may be implemented to perform transformer coupled plasma (TCP) substrate etching, layer depositions, and/or sputtering.

Connected to vacuum transport module 106 is a load lock 104 that may be implemented to introduce substrates into vacuum transport module 106. Load lock 104 may be coupled to a clean room 102 where substrates are stored. In addition to being a retrieving and serving mechanism, load lock 104 also serves as a pressure-varying interface between vacuum transport module 106 and clean room 102. Therefore, vacuum transport module 106 may be kept at a constant pressure (e.g., vacuum), while clean room 102 is kept at atmospheric pressure. Consistent with the growing demands for cleanliness and high processing precision, the amount of human interaction during and between processing steps has been reduced by the use of robots 110 to transfer the wafers from the clean room 102 to the load lock 104.

Figure 1B:
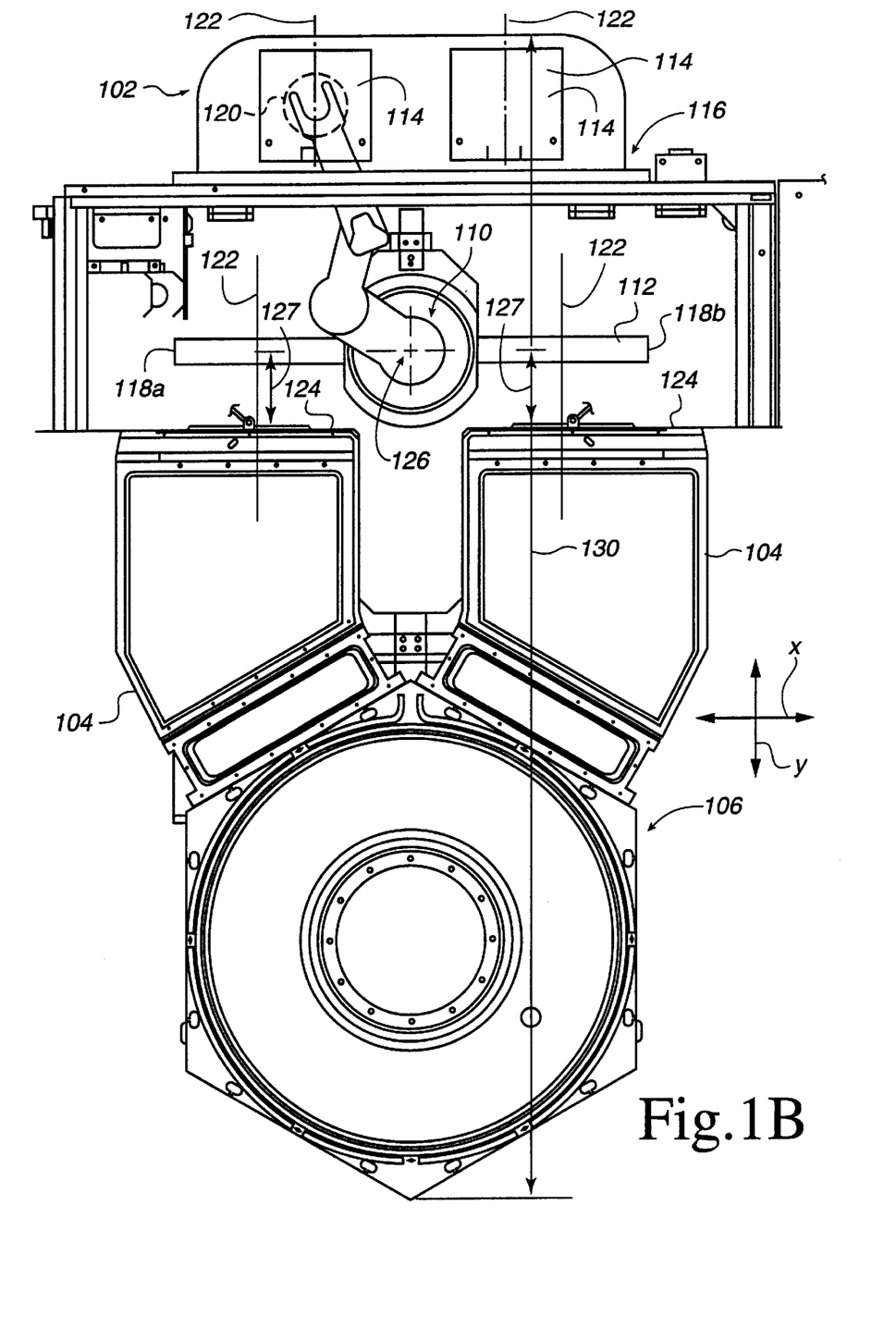
FIG. 1B depicts a typical robot on a track for transferring a wafer from a wafer cassette to the load lock.

FIG. 1B depicts a prior art robot 110 mounted along a track 112 between wafer cassettes 114 and two load locks 104 provided in the clean room 102. The clean room 102, with the cassettes 114 and the robot 110, is maintained at atmospheric pressure, thus these items may be referred to as parts of an atmospheric transfer module 116. The robot 110 can be moved transversely along the linear track 112 between ends 118a and 118b to facilitate removing a wafer 120 straight out of one of the cassettes 114. That is, during removal the wafer 120 must be aligned with a wafer transfer axis 122 that extends in the direction of a y-axis. The aligned transfer has been used to avoid difficulties experienced in the past in controlling robots during wafer transfer, e.g., when the base of the robot is rotated (theta motion) on a vertical axis at the same time as the arms of the robot are moved in an extend motion.

The load locks 104 are mounted opposite to the cassettes 114 and have front faces, or wafer transfer faces, 124 that are parallel to the track 112 and extend in the direction of an x-axis. Generally, there is a minimum distance (along the wafer transfer axis 122 of the load lock 104) required between the robot 110 (hence between the track 112) and the load lock 104 into which a wafer 120 is to be transferred. This minimum distance is the minimum distance required by the robot 110 to transfer a wafer 120 straight into the load lock port without rotation of the robot 110 on a robot central axis of rotation 126, and may be referred to as a wafer transfer distance, or wafer feed distance. The wafer feed distance is depicted by the dimension line 127 having opposite arrowheads and extending between the track 112 and the face 124 of the load lock 104. The wafer feed line, or dimension line, 127 is shown extending in the direction of the y-axis parallel to the wafer transfer axis 122, and both the line 127 and the axis 122 are perpendicular to the track 112 and to the y-axis.

Figure 1C:
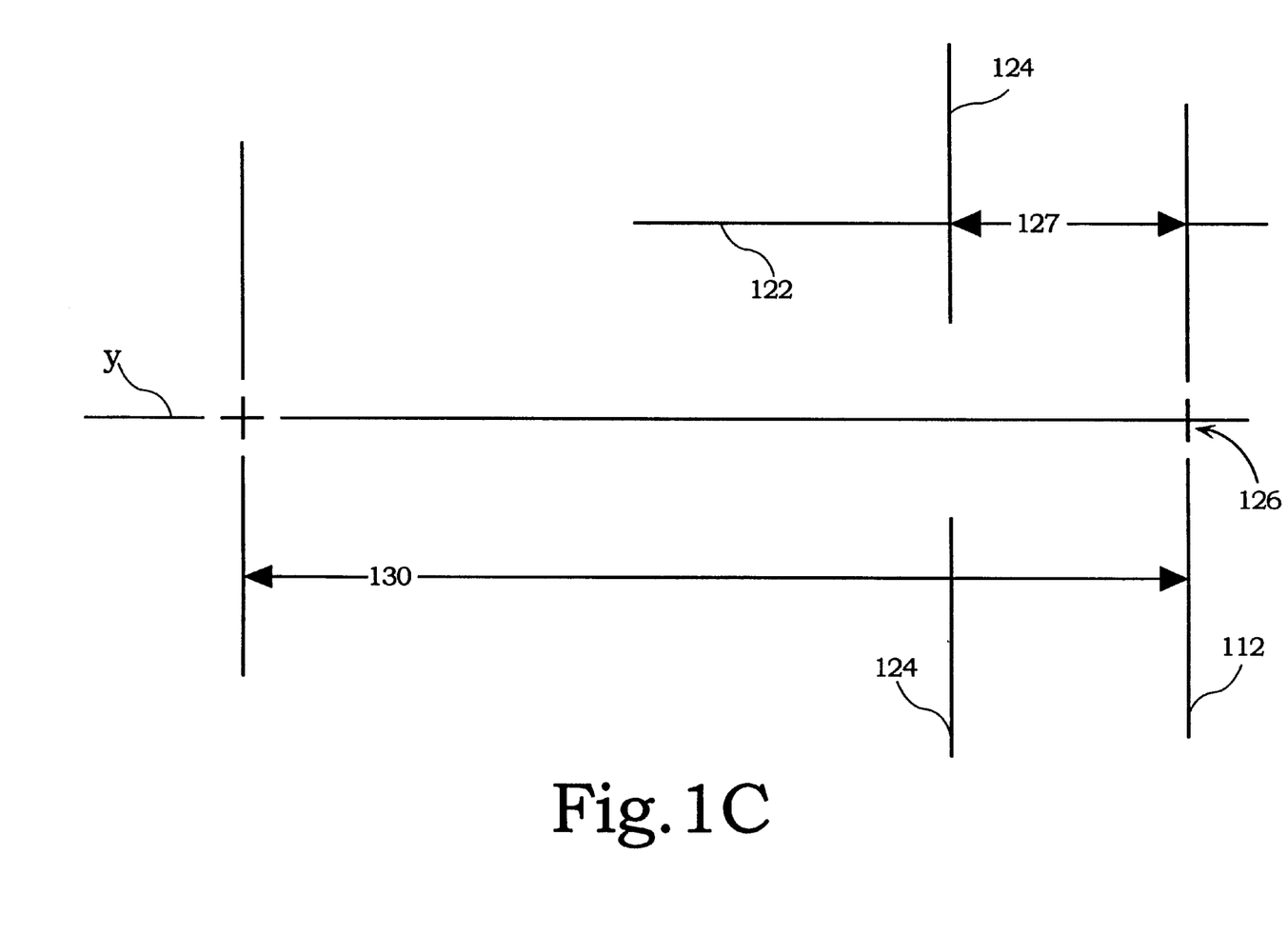
FIG. 1C is a schematic diagram illustrating dimensions of elements shown in FIG. 1B, including an entire length of a wafer transfer distance between the track and a face of the load lock extending parallel to the direction of a footprint dimension line of the modules.

The size of the robot track 112, and the need to lubricate the robot track 112, have caused problems in that the robot track 112 is relatively long in the direction of the y-axis. Also, lubrication on the track 112 is exposed, and is thus a "dirty" element in the otherwise "clean", clean room 102. Further, the length of the wafer transfer distance 127 must separate the robot 110, or the track 112, firm the face 124 of the load locks 104. In the past the length of the entire wafer feed distance, or dimension line, 127 extending in the direction of the y-axis has been between the track 112 and the face 124. A footprint of the combined atmospheric transfer module 116 and vacuum transfer module 106 is generally defined by the floor area occupied by these modules 106 and 116, such that the footprint is proportional to floor area dimensions along the x and y axes. Thus, the relatively long length of the track 112 in the direction of the x-axis, and the length of the entire wafer transfer distance 127 extending in the direction of the y axis, contribute to the size of the footprint of these modules 106 and 116. As shown in FIGS. 1B and 1C, in the direction of the y-axis, the length of a footprint dimension line 130 contributes to the size of the footprint. It is observed that the length of the entire wafer transfer distance 127 extending in the direction of the y-axis is part of the footprint dimension line 130, for example. In view of the increased cost of building and supporting clean run environments for such equipment, there is a great need to reduce the resulting footprint. In addition, if equipment footprint can be made smaller, production can be increased using the same amount of clean room space.

In view of the forgoing, what is needed is a robot that avoids the need for a track that is relatively long in the direction of the y-axis, and that does not present a track lubrication problem. Also, since there is a minimum length of the wafer transfer distance that must separate a robot from a wafer transfer face of a load lock, what is needed is a way of avoiding having that entire minimum length extend in the direction of the y-axis, such that the length of a footprint dimension line 130 extending in the direction of the y-axis, for example, does not include such entire minimum length. Further, in operations for transferring wafers into load locks, it should not be necessary to rotate the base of the robot on a vertical axis at the same time as the arms of the robot are moved in an extend motion.

SUMMARY OF THE INVENTION

Broadly speaking, the present invention fills these needs by providing a load lock wafer transfer face at an acute angle with respect to a footprint dimension line, such that the length of the footprint dimension line does not include the entire minimum length of the wafer transfer distance that must separate a robot from the wafer transfer face of a load lock.

When two adjacent load locks are provided for use with a robot, the two load lock wafer transfer faces define a nest, and are said to be nested, in that each such face is at the acute angle with respect to the footprint dimension line. The present invention additionally fills these needs by providing a robot mounted for rotation at a fixed location relative to wafer cassettes and to the nested load lock wafer transfer faces, thus avoiding the use of a robot track. Also, although the fixed location is separated from each of the two wafer transfer faces by the minimum wafer transfer distance, because the faces are at the acute angle, there is only a component of, and not the entire, minimum wafer transfer distance in the length of, or extending in the direction of, the footprint dimension line.

The present invention achieves these results by positioning the robot at least partly in the nest formed by the adjacent load lock faces without requiring rotation of the base of the robot on a vertical axis at the same time as the arms of the robot are moved in an extend motion during wafer transfer into the load lock.

As a result of the nesting of the faces of the load lock at the acute angles, the footprint of the modules may be substantially reduced, in that at least one dimension of the footprint is minimized as described below. At the same time, with the robot located at least partly in the nest the robot may operate with only the relatively simple extend motion to transfer the wafers into the load locks, avoiding the more problematic combined robot rotation and extend motion.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention is described for substantially reducing the footprint of a cluster tool architecture system, and for allowing a front end robot of the system to operate with only relatively simple extend and rotate motions to transfer wafers into a load lock. The invention is described in terms of providing at least one wafer transfer face of a load lock at an acute angle with respect to a footprint dimension line, such that the length of the footprint dimension line does not include an entire minimum length of a wafer transfer distance that must separate the robot from the wafer transfer face of the load lock. More particularly, the invention is described in respect to two load lock faces and to methods of orienting such faces relative to the footprint dimension line. It will be obvious, however, to one skilled in the art, that the present invention may be practiced without some or all of these specific details. In other instances, well known process operations have not been described in detail in order not to obscure the present invention.

Figure 2A:
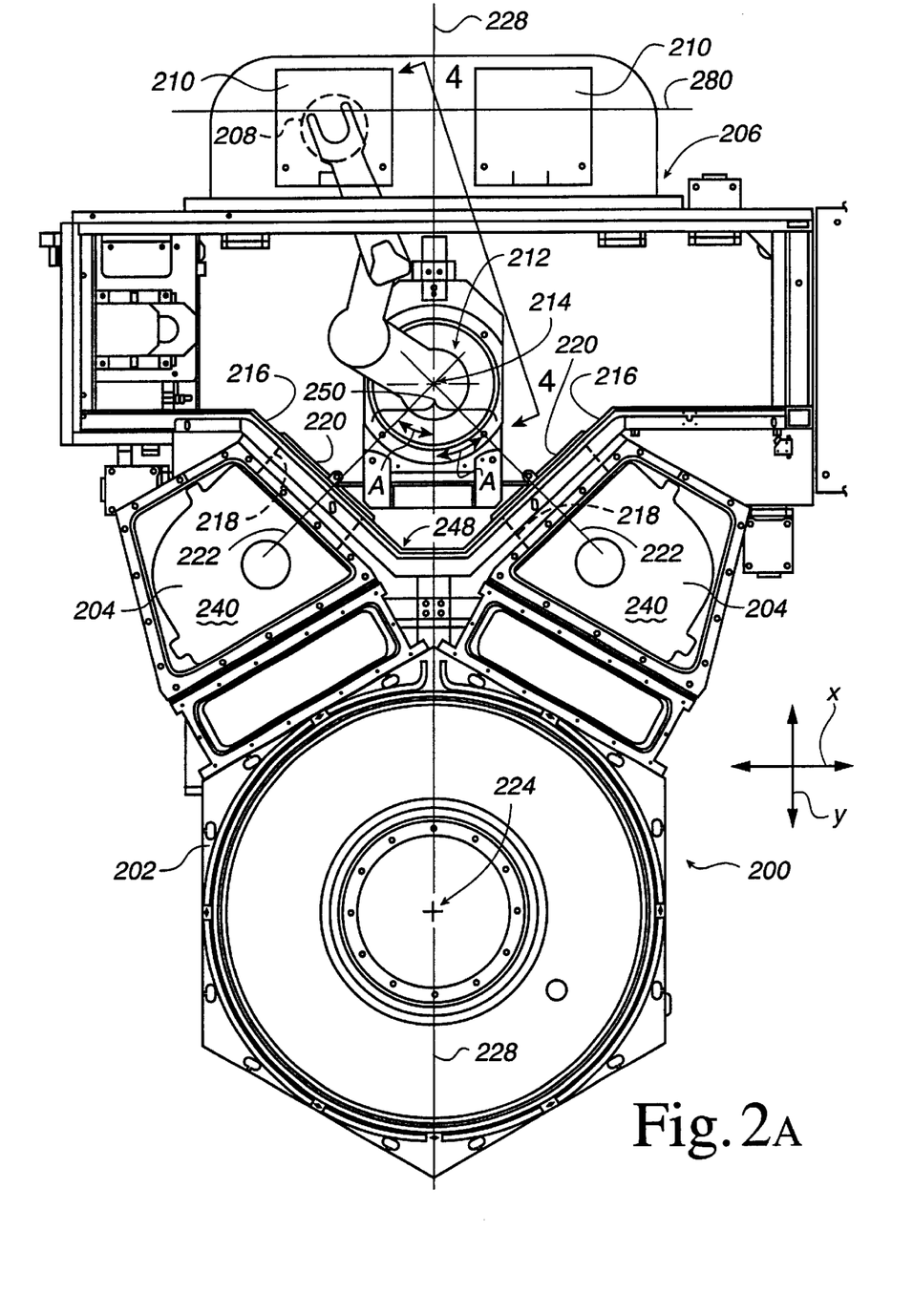
FIG. 2A is a plan view of a semiconductor process cluster tool architecture according to the present invention, illustrating a robot mounted for rotation on a fixed axis and at least partially in a nest defined by adjacent faces of load locks positioned relative to each other at an acute angle with respect to of a footprint dimension line of modules of the architecture.

Referring to FIG. 2A, the invention is generally described as including a semiconductor process cluster tool architecture system 200 having a vacuum transport module 202, at least one load lock 204 (or wafer transport enclosure), and an atmospheric transport module 206 for transferring substrates, or wafers, 208 from one or more cassettes 210 to the load locks 204. Preferably, two adjacent load locks 204 are provided, one at each of two adjacent sides of the vacuum transport module 202, and the atmospheric transfer module 206 includes at least two cassettes 210 and a front end robot 212 mounted on a fixed axis of rotation 214. Each of the load locks 204 has a wafer receiving face 216 provided with a port 218 through which the wafers 208 may be transferred. Each port 218 may be closed by a gate valve, or door, 220. The robot 212 transfers the wafers 208 through the ports 218 along a wafer transfer axis 222 that is centrally positioned relative to the port 218 and is perpendicular to the face 216. From the load locks 204, the wafers 208 are transferred to the vacuum transport module 202. The module 202 also includes a robot (not shown) that is installed at a central axis 224.

Considering FIG. 2A as a plan view, a footprint of the combined atmospheric transfer module 206 and vacuum transfer module 202 is generally defined by the floor area occupied by these modules 202 and 206. The footprint is proportional to floor area dimensions along the x and y axes. Therefore, in an attempt to decrease the footprint of the cluster tool architecture system 200 it is important to reduce at least one of the dimensions x or y of the modules 202 or 206.

For example, to decrease the footprint of the cluster architecture system 200, the present invention reduces the value of the dimension of the modules 202 and 206 in the y axis direction. To facilitate description of such reduction of the dimension in the direction of the y axis, reference is made to a footprint dimension line 228 which extends parallel to the y axis.

Figure 2B:
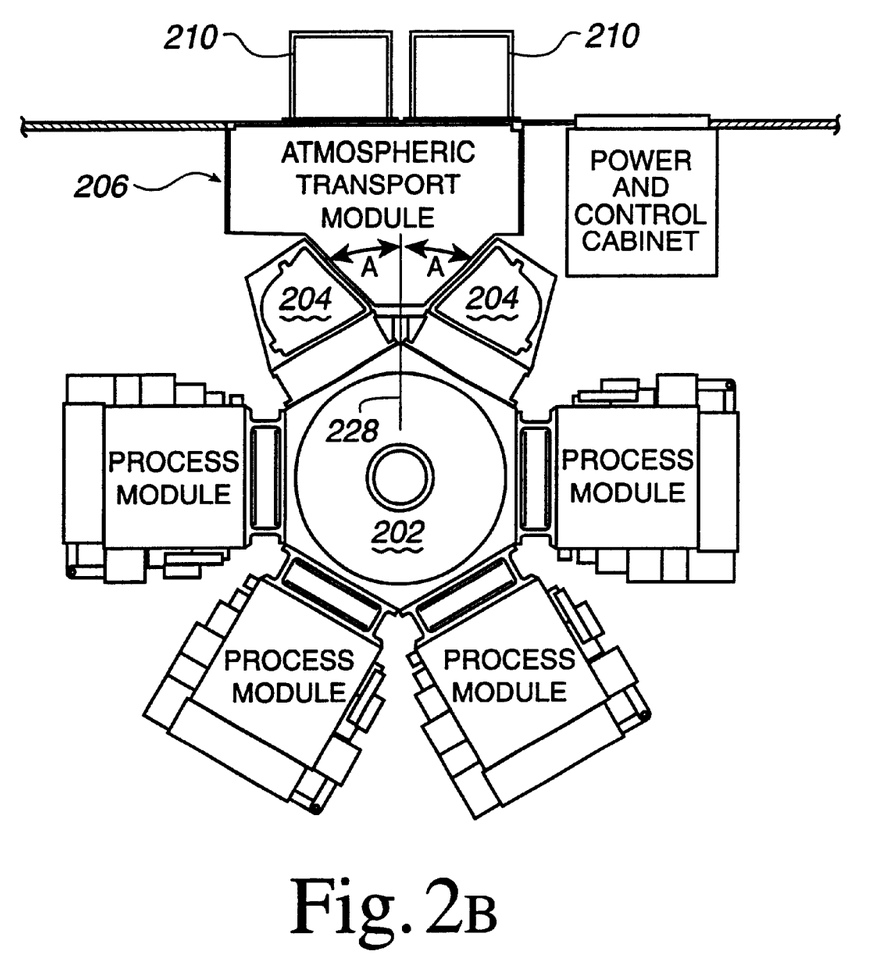
FIG. 2B illustrates a cluster architecture diagram, wherein a plurality of process modules are connected to a common transport module, in accordance with one embodiment of the present invention.

FIG. 2B illustrates how the atmospheric transport module 206, the load locks 204 and process modules are connected to a transport module 202. In this diagram, the load locks are shown oriented in the above described angel A relative to line 228.

Figure 3:
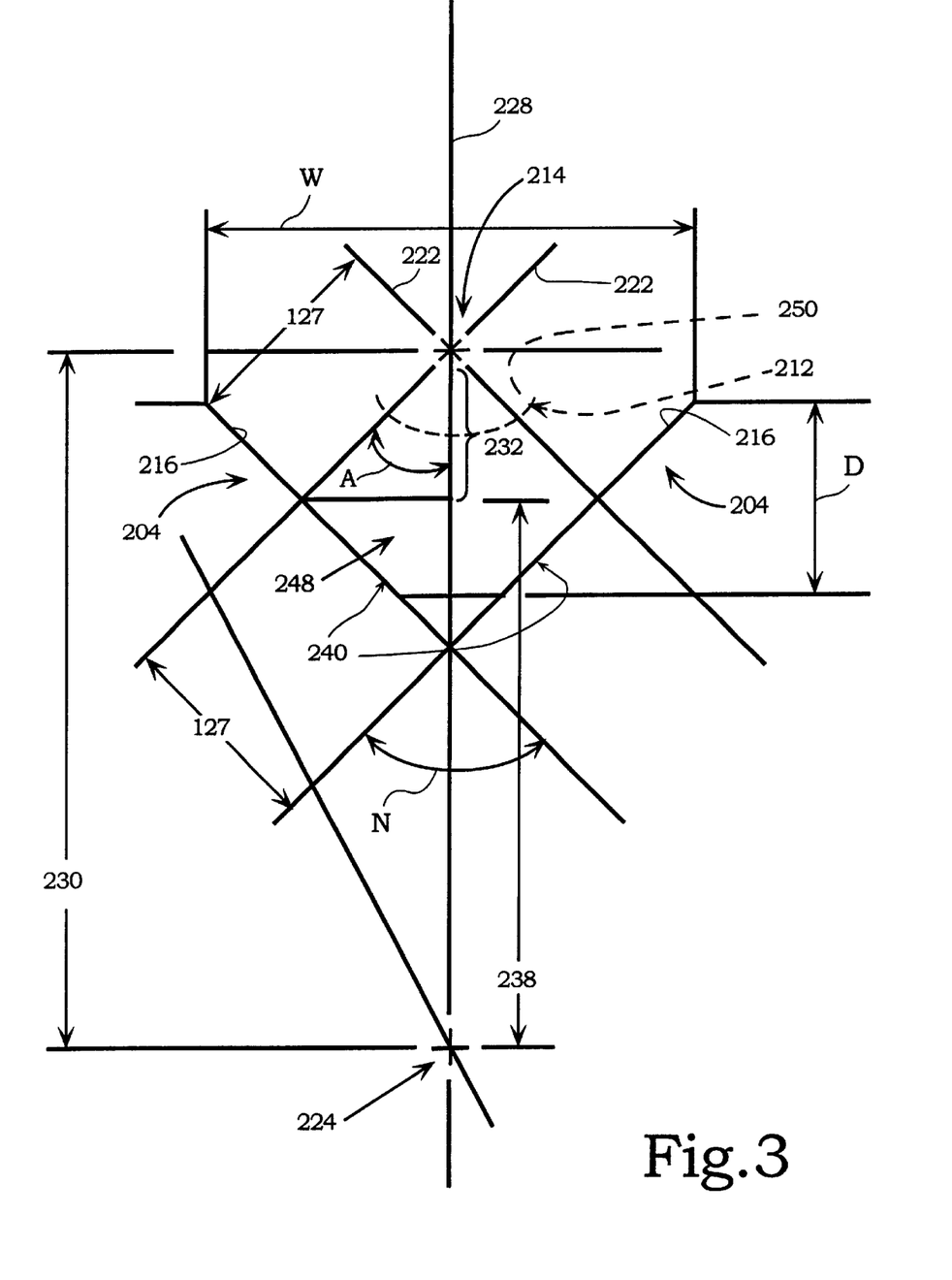
FIG. 3 is a schematic diagram illustrating dimensions of elements shown in FIG. 2A, including an entire length of a wafer transfer distance between the robot axis of rotation and a face of the load lock extending at an acute angle with respect to the direction of a footprint dimension line, wherein the faces of adjacent load locks define a nest for the robot.

FIG. 3 shows a portion of the extent, or value, of the footprint dimension line 228. The portion is illustrated between the central axis 224 and the fixed robot axis of rotation 214 and is shown by the dimension 230. The orientation of the wafer receiving face 216 of the load lock 204 may be described with respect to the orientation of the wafer transfer axis 222 relative to the footprint dimension line 228. It is recalled that the above description noted that there is a minimum distance (along the prior art wafer transfer axis 122 of the load lock 104) required between the robot 110 (or the track 112) and the load lock 104 into which a wafer 120 is to be transferred. This minimum distance is the minimum distance required by the robot (whether a prior art robot or a robot of the present invention) to transfer a wafer 120 straight into the load lock port without rotation of the robot on the central axis of the robot.

This minimum distance was referred to as the wafer transfer distance, or wafer feed distance, and was depicted by the dimension line 127 having opposite arrowheads and extending between the track 112 and the face 124 of the load lock 104. The line 127 in the prior art was shown extending in the direction of the y-axis parallel to the wafer transfer axis 122, and both the line 127 and the wafer transfer axis 122 were shown perpendicular to the track 112 and to the y-axis.

In the present invention, for the same reasons, there is also a wafer feed distance, which is shown in FIG. 3 as the dimension 127. The wafer feed distance is referred to using the reference number 127 (as illustrated by the dimension 127), and is the minimum distance required by the robot 212 to transfer a wafer 208 straight into the port 218 without rotation of the robot 212 on the axis 214. FIGS. 2 and 3 show the wafer transfer axis 222 extending perpendicular to each face 216 of the load locks 204 and parallel to the direction of the distance 127. Also, the minimum wafer feed distance 127 is between the robot 212 (measured at the axis 214) and the face 216 of each of the load locks 204 into which the wafer 208 is to be transferred.

Whereas in FIG. 1C the prior art dimension line 127 is shown extending in the direction of the y-axis, the present invention reduces the effective amount, or value, of the minimum wafer feed distance 127 that is in the direction of, for example, the y-axis of the modules 202 and 206. In detail, the effective value of the minimum distance 127 that is in the direction of the y-axis of the modules 202 and 206 is reduced in that the wafer transfer axis 222 extends at an angle A with respect to the y-axis. FIG. 3 shows a result of the axis 222 extending at the angle A. First, the minimum distance 127 remains at the minimum value between the axis 214 and each of the faces 216. Also, each of the wafer transfer axes 222 remains perpendicular to the respective face 216. The effect of the angle A is that the value of a portion 232 of the dimension 230 that is based on the minimum distance 127 is reduced as a function of sin A (the sin of the angle A). Thus, the dimension 230, composed of a dimension 238 and the portion 232, has a lower value, which directly reduces the footprint of the modules 202 and 206.

The word "minimize" is used to describe this effect on the value of the footprint dimension line 228 (and on the dimension 230) between the robot axis 214 and the central axis 224. FIGS. 2A and 3 show that one result of the present invention is to include in the footprint dimension line 228 less than all of the wafer feed distance 127. In detail, because the receiving face 216 is at the acute angle A relative to the footprint dimension line 228, when the wafer feed distance 127 is projected perpendicularly onto the footprint dimension line 228, the result is the value of the portion 232. The portion 232 is a projected wafer feed distance, also referred to as the projected wafer feed distance, 232. In other words, as seen in FIG. 2A, because of the angle A, the value of the projected wafer feed distance (or portion) 232 is less than the value of the original wafer feed distance 127, and this value of the distance 232 varies as a function of the sin of the angle A. The term "minimize" is used to denote one aspect of the present invention, which is that in one sense the projected wafer feed distance 232 at least less than the original wafer feed distance 127, with the reduced amount being in proportion to the sin of the angle A of the axis 222 relative to the footprint dimension line 228.

The term "minimize" also denotes the least value of the projected distance 232, i.e., the maximum amount of such reduction, which, for example, may result from orienting the wafer receiving face 216 relative to the footprint dimension line 228 at a value of the angle A such as forty-five degrees. With the footprint dimension line 228 including the projected wafer feed distance 232 (rather than the entire wafer feed distance 127), plus a second distance 238, the distance 230 may have a value of about 43.4 inches, for example, which may be three or four inches less than the value of the footprint dimension line 130.

As an example, a typical vacuum transport module 202 and atmospheric transport module 206 could have a wafer feed distance 127 of about 11.6 inches. With the faces 216 oriented at an angle of about 45 degrees, for example, the projected distance 232 would be about 8.2 inches, which is a decrease of about 3.4 inches as compared to the original value of the wafer feed distance 127.

In another aspect of the present invention, the load locks 204 may be described as a pair 240 of load locks 204 in that the load locks 204 have a defined positional interrelationship. In particular, each load lock 204 of the pair 240 of load locks 204 has one of the faces 216 that is positioned relative to the other face 216 so as to define a nest 248. Further, FIGS. 2 and 3 show the front end robot 212 having at least a portion 250 located in the nest 248.

The word "nest" describes the relationship of the receiving faces 216 of the pair 240 relative to each other and to the robot axis 214 and the robot 212. FIG. 2A shows the receiving faces 216 positioned relative to each other at an angle. FIG. 3 identifies this angle as an angle N, which has twice the value of the value of the angle A. The angle A is preferably an acute angle, and most preferably has a value of about forty-five degrees. It may be understood that the angle N is preferably an acute angle, and most preferably has a value of about ninety-degrees (i.e., two times forty-five degrees). With the faces 216 positioned relative to each other at the angle N, the faces 216 are said to define the nest 248. FIG. 3 depicts the nest 248 as a space between the opposing faces 216 and having a generally triangular cross-section defined by a depth D and a width W.

When the robot 212 is at least partially positioned in the nest 248, i.e., is partially positioned in the generally triangular space between the faces 216 (e.g., as shown in FIGS. 2 and 3), the robot 212 is said to be "nested". A result of the robot 212 being nested (i.e., at least partially positioned in the nest 248) is that the footprint dimension 230 has a reduced value, i.e., it is "minimized" as described above. In other words, the portion 232 of the footprint dimension 230 has a reduced value in the direction of the y axis, as compared to the value of the entire wafer feed dimension 127. Further, the robot 212 is mounted for rotation on the robot axis 214, which is a fixed location relative to the wafer cassettes 210 and to the nested wafer transfer faces 216, which avoids use of a robot track 112.

Figure 4:
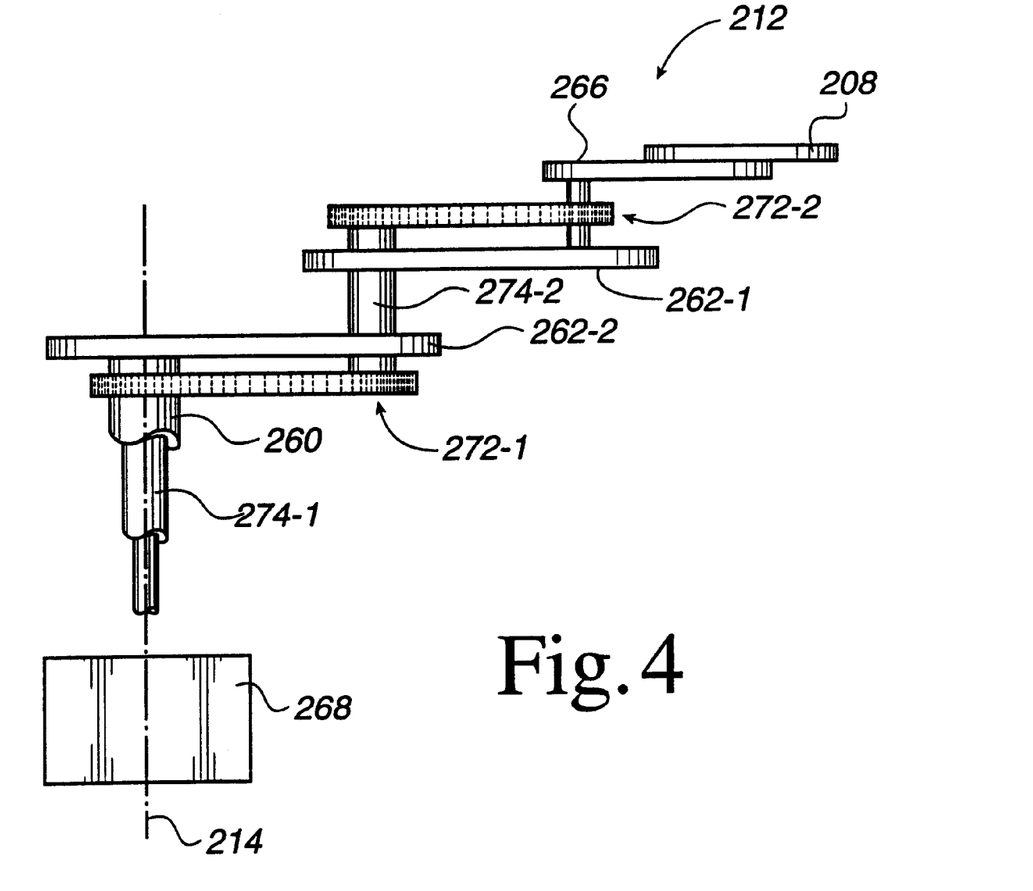
FIG. 4 is a schematic view taken along line 4—4 in FIG. 2A depicting the robot transferring a wafer from the cassette.

FIG. 4 shows the robot 212 as including a base 260 mounted for rotation on the axis of rotation 214. The robot 212 may be one manufactured by Brooks Automation, Inc. of Chelmsford, Mass., having Model Number MAG-7. The robot 212 may have a plurality of hinged links 262, a distal one of the links 262-1 supporting 266 on which a wafer 208 may be supported. Adjacent pairs of the links 262 are pivotally connected to each other. A drive 268 rotates the base 260 on the axis 214 for changing the angular position of a second link 262-2. Once a desired angular position has been reached, the drive 268 stops the movement of the base 260 on the axis 214, and may then cause the links 262 to perform an extend motion, which is a linear motion with the wafer 208 centered on and moving along the wafer transfer axis 222. During the extend motion, the links 262 position the portion 266 (which is sometimes referred to as an end effector) for movement along the wafer feed axis 222 through the port 218 and into the load lock 204 as shown in FIG. 2A. The drive 268 may, for example, include a series of toothed belts 272 and shafts 274. A first shaft 274-1 drives a first belt 272-1 to rotate the distal link 262-1. A second shaft 274-2 drives a second belt 272-2 to rotate the portion 266. As desired for transferring a wafer 208 from a cassette 210, the drive may cause the base 260 to rotate on the axis 214 (theta motion) at the same time as the drive 268 operates the shafts 274 and the belts 272 for the extend motion stationary on the robot axis to supply a wafer to one of the load locks. The movement of the robot is therefore a coordinated one, wherein the path is in the form of a curve defined by a combination of rotation and extension.

Figure 5:
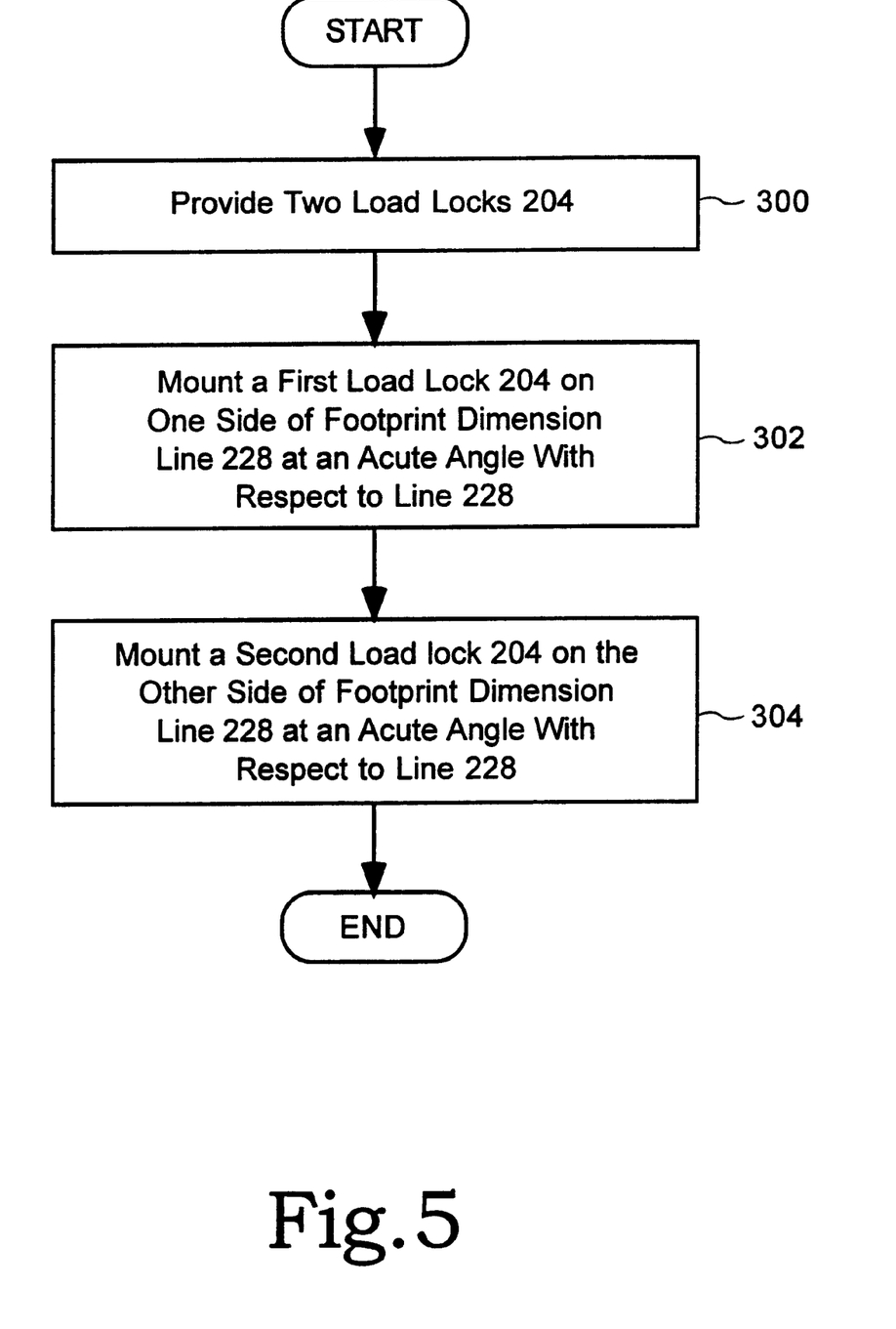
FIGS. 5–8 depict various operations of a method of arranging the load locks of the present invention relative to a front end robot.

Another aspect of the present invention is a method of arranging the load locks 204 relative to the front end robot 212 for transferring the wafers 208 from one of the two depicted wafer supply cassettes 210 of the atmospheric transport module 206 to the vacuum transport module 202. The cassettes 210 are mounted along a cassette axis 280 spaced from the robot axis 214. As shown in FIG. 5, the method includes an operation 300 of providing two of the load locks 204. Each of the load locks has the face 216 that is generally planar and is provided with the port 218 for admitting the wafer 208 into the load lock 204. In an operation 302, a first of the load locks 204 is mounted on one side of the footprint dimension line 228, such as on the left side as viewed in FIG. 2A. The mounting of the first load lock 204 is with the face 216 at a first acute angle with respect to the footprint dimension line 228. In an operation 304, a second of the load locks 204 is mounted on a second side of the footprint dimension line 228. The mounting of the second load lock 204 is at a second acute angle with respect to the footprint dimension line 228. The second side may be on the right hand side of the footprint dimension line 228 as viewed in FIG. 2A, opposite to the left side. FIG. 2A shows that the mounting operations 302 and 304 are effective to define an intersection of the planes of the faces 216 of the first and second load locks 204, so that the intersection coincides with the footprint dimension line 228.

Figure 6:
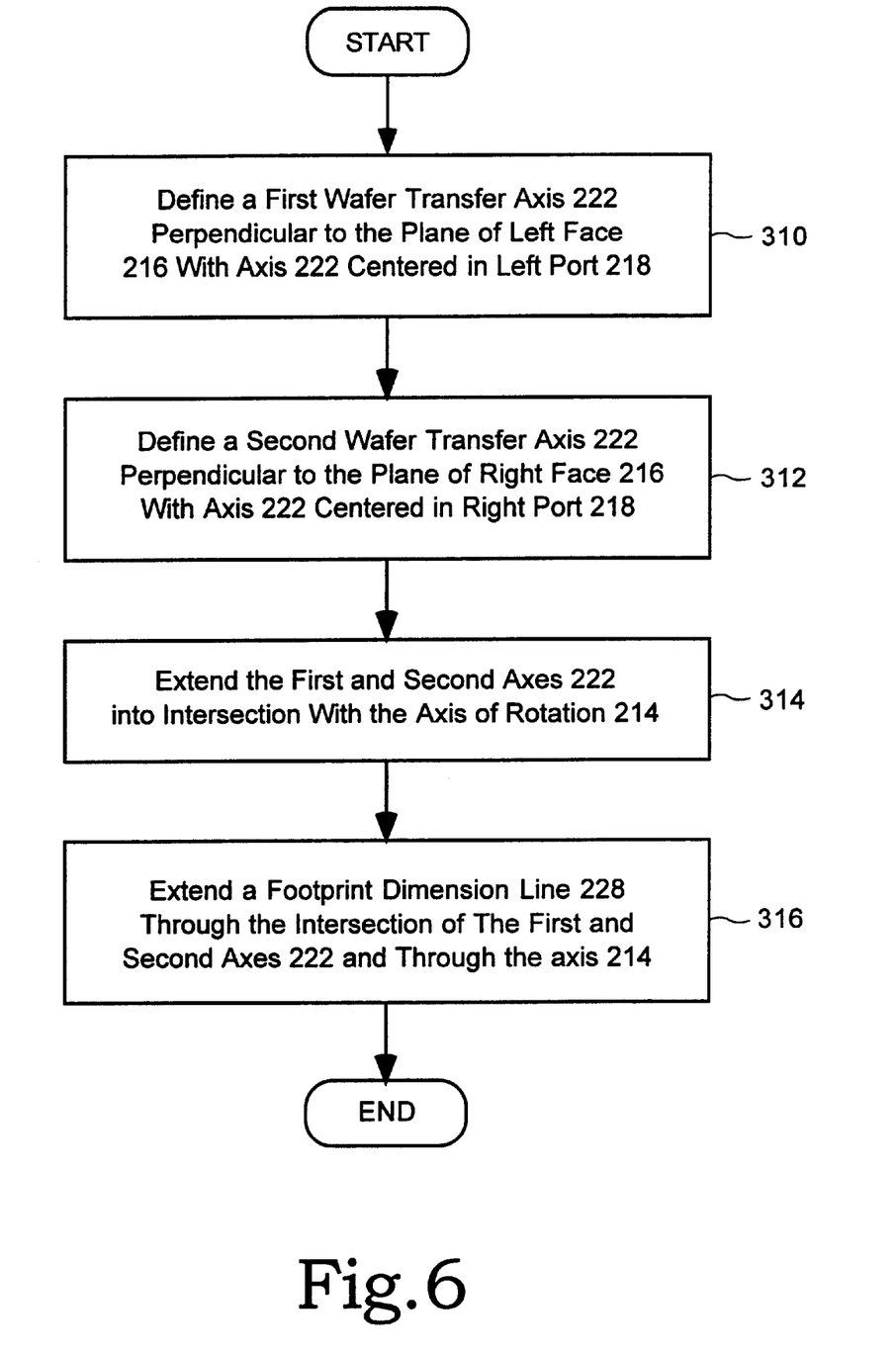

FIG. 6 shows another aspect of the present method of arranging the load locks 204 relative to the front end robot 212 for transferring the wafers 208 from one of the two depicted wafer supply cassettes 210 of the atmospheric transport module 206 to the transport module 202. An operation 310 defines the first wafer transfer axis 222 perpendicular to the plane of the face 216 of the first (left side) load lock 204, wherein the axis is centered relative to the port 218 of the first load lock 204. An operation 312 defines the second wafer transfer axis 222 perpendicular to the plane of the face 216 of the second (right hand) load lock 204, wherein the second axis 222 is centered relative to the port 218 of the second load lock 204. An operation 314 extends the first and second wafer transfer axes 222 into intersection with the axis of rotation 214. An operation 316 extends the footprint dimension line 228 through the intersection of the first and second wafer transfer axes 222, that is through the axis 214. Preferably, the mounting operations 310 and 312 cause the first acute angle A to be substantially equal to the second acute angle A. More preferably, the first and second acute angles A have a value equal to about forty-five degrees.

Figure 7:
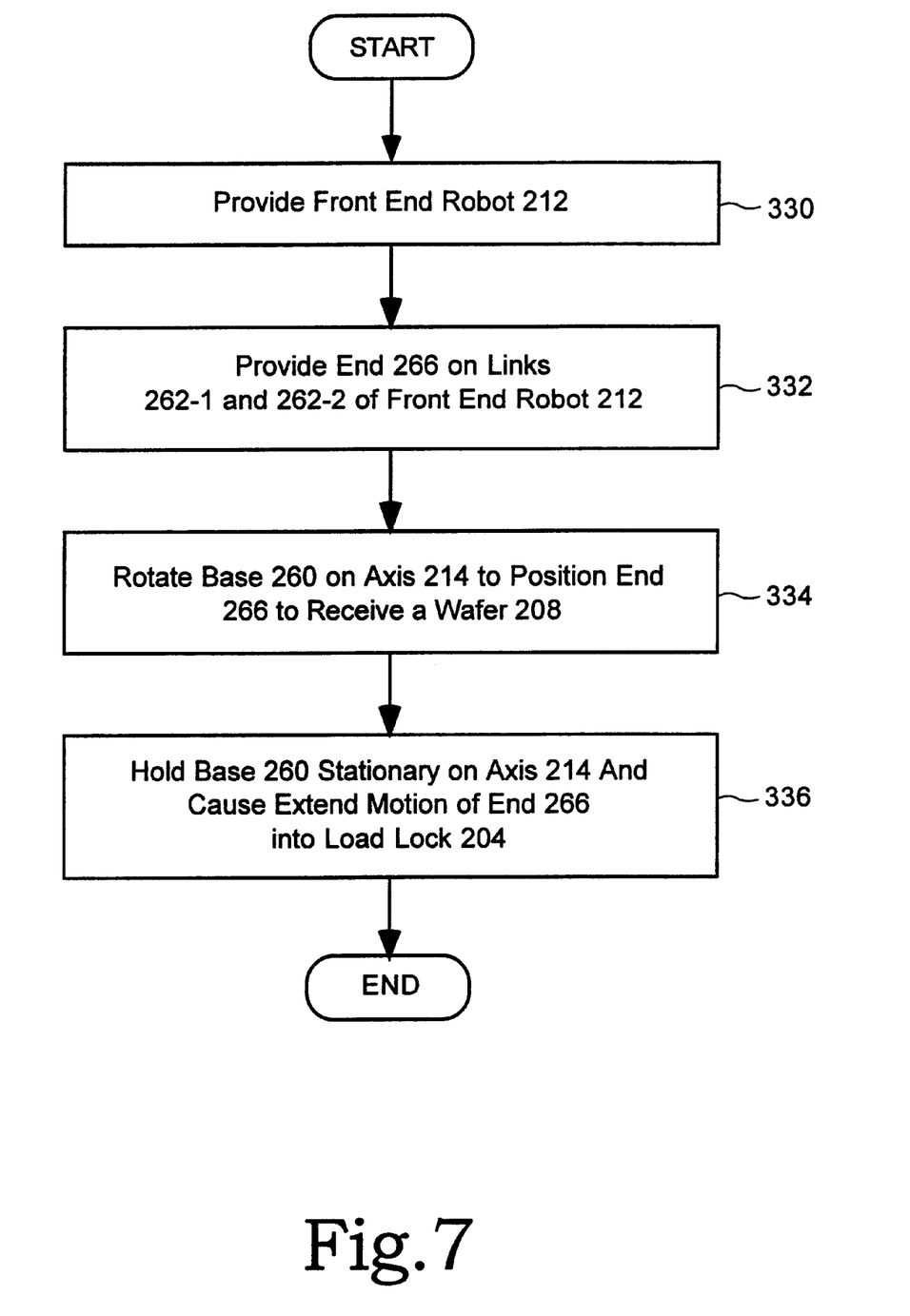

FIG. 7 shows another aspect of the present method of arranging the load locks 204 relative to the front end robot 212 for transferring the wafers 208 from one of the two depicted wafer supply cassettes 210 of the atmospheric transport module 206 to the transport module 202. In operation 330, the front end robot 212 is provided and includes the base 260 mounted for theta rotation on the axis of rotation 214. In an operation 332, the end 266 is mounted on the base 260 via the links 262-2 and 262-1, and the plurality of links 262-1 and 262-2 are provided, with the first of the links 262-2 pivotally mounted on the base 260, and a second of the links 262-1 being pivotally mounted on the first link 262-2. In the operation 334, the end 266 is pivotally mounted on the second link 262-1. In an operation 334, the base 260 is rotated on the axis of rotation 214 to move the first and the second links 262-2 and 262-1 and the end 266 relative to the respective base 260 and the second link 262-1 to receive a wafer 208 from one of the cassettes 210. In an operation 336, the base 260 is held stationary relative to the axis of rotation 214 while extending the end 266 to transfer the wafer 208 into one of the load locks 204.

Figure 8:
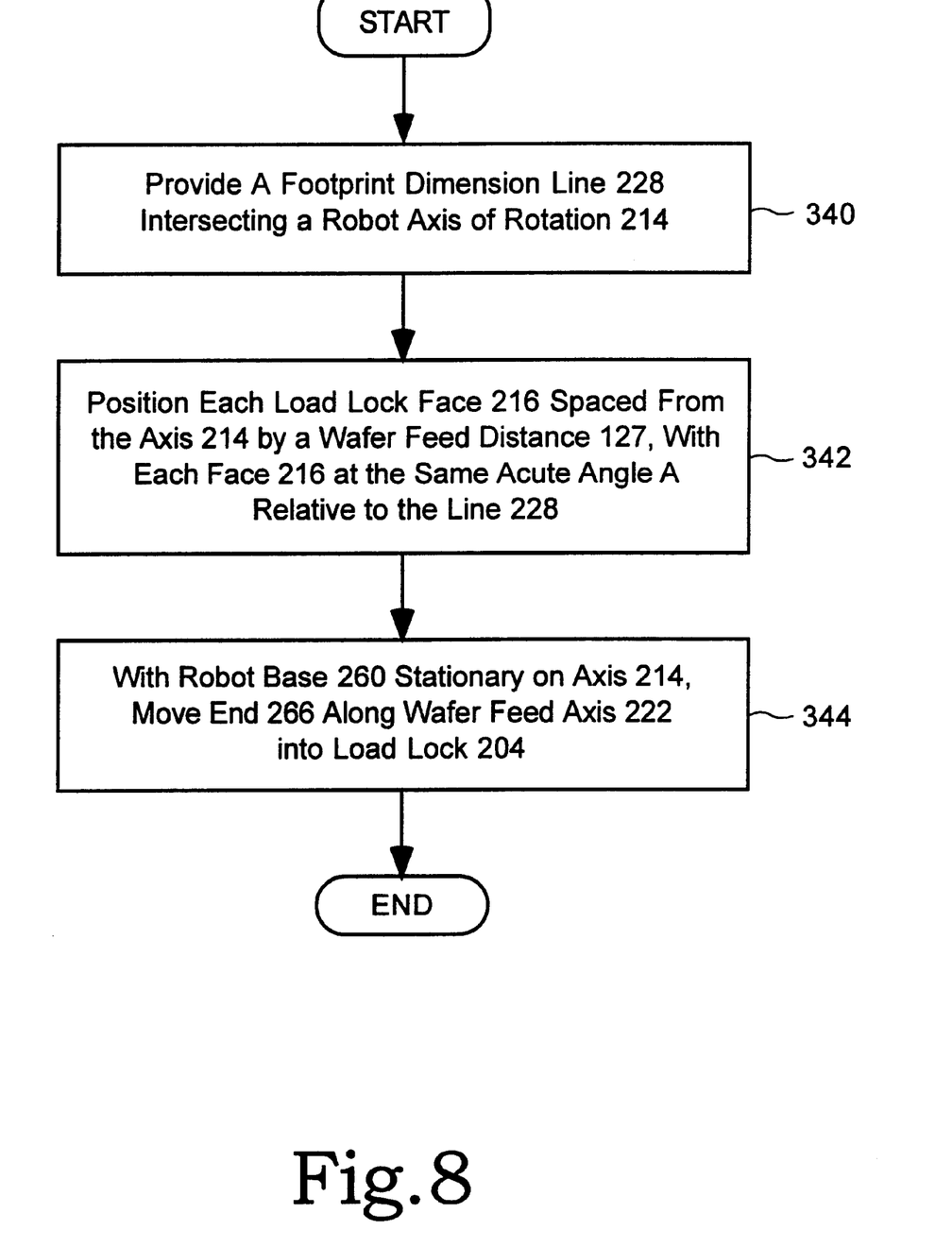

FIG. 8 shows another aspect of the present method of arranging the load locks 204 relative to the front end robot 212 for transferring the wafers 208 from one of the two depicted wafer supply cassettes 210 of the atmospheric transport module 206 to the transport module 202. In operation 340, the footprint dimension line 228 is provided intersecting the robot axis of rotation 214. In operation 342, each of the respective faces 216 of each of the load locks 204 is spaced from the robot axis of rotation 214 by the wafer feed distance 127; wherein each wafer feed distance 127 is measured along the wafer feed axis 222 extending from the axis of rotation 214 perpendicular to the respective face 216. The wafer feed distances 127 are equal to each other, and each respective face 216 is positioned relative to the footprint dimension line 228 at the same acute angle A. In an operation 344, with the base 260 stationary relative to the axis of rotation 214, the drive 268 is effective to cause the extend movement of the respective end 266 along the respective wafer feed axis 222 to position the wafer 208 in the respective load lock 204 without the theta movement of the base 260.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A transport module for transferring a semiconductor wafer to a vacuum transport system, the vacuum transport system having a central system axis; the module and the system having a footprint defining the area occupied by the module and the system, the transport module comprising:

a wafer supply for holding a wafer to be transferred to the vacuum transport system, the wafer supply having a central supply axis;

the footprint being proportional to a distance between the central system axis and the central supply axis, the distance being measured along a footprint dimension line extending from the central system axis to the supply axis; and a wafer transfer enclosure having a wafer receiving face provided with a port for receiving the wafer from the wafer supply; the wafer receiving face being spaced from the central supply axis by a wafer feed distance measured perpendicularly with respect to the wafer receiving face; the wafer receiving face being oriented at an acute angle relative to the footprint dimension line so that when the wafer feed distance is projected onto the footprint dimension line the value of the projected wafer feed distance is less than the value of the entire wafer feed distance such that the value of the footprint dimension line is minimized.

2. A transport module as recited in claim 1, wherein a wafer feed line extending through the central supply axis extends perpendicularly with respect to and through the wafer receiving face, the transport module further comprising:

the wafer supply comprising a robot having an axis of rotation coinciding with the central supply axis, the robot having a plurality of hinged links, a distal one of the links supporting an end, adjacent pairs of the links being pivotally connected to each other so that with the robot stationary on the axis of rotation the links position the end for movement along the wafer feed line into the wafer transfer enclosure.

3. A transport module as recited in claim 1, wherein the acute angle is about forty-five degrees.

4. A transport module as recited in claim 1, wherein the wafer enclosure is a first wafer enclosure; and wherein the acute angle is a first acute angle; the transport module further comprising:

the first wafer enclosure being mounted on one side of the footprint dimension line; and a second wafer enclosure provided on the side of the footprint dimension line opposite to the side on which the first wafer enclosure is mounted, the second wafer enclosure having a second wafer receiving face provided with a second port for receiving the wafer from the wafer supply; the second wafer receiving face being spaced from the central supply axis by the wafer feed distance measured perpendicularly with respect to the second wafer receiving face; the second wafer receiving face being oriented at a second acute angle relative to the footprint dimension line, the second acute angle being equal to the first acute angle so that when the wafer feed distance of the second wafer transport enclosure is projected onto the footprint dimension line the value of the projected wafer feed distance of the second wafer transport enclosure is less than the value of the entire wafer feed distance of the second wafer enclosure such that the value of the footprint dimension line is minimized.

5. A transport module as recited in claim 4, further comprising:

the angle between the first face and the second face is about ninety degrees;

the first face and the second face define a nest; and at least a portion of the wafer supply being in the nest.

6. A transport module as recited in claim 4, further comprising:

the wafer supply is a robot having a base and an axis of rotation, at least a portion of the base of the robot being mounted in the nest.

7. An atmospheric transport module for transferring a semiconductor wafer to a vacuum transport system, the vacuum transport system having a central system axis; the module and the system having a footprint defining the area occupied by the module and the system, comprising:

a pair of load locks, each load lock having a face provided with a port for receiving the wafer, the faces being positioned relative to each other so as to define a nest; and a front end robot having at least a portion located in the nest, the front end robot having an end effector for holding a wafer to be transferred to the vacuum transport system via one or the other of the load locks of the pair of load locks.

8. An atmospheric transport module as recited in claim 7, further comprising:

the front end robot having a central axis of rotation;

the footprint of the system being proportional to a distance between the central system axis and the central axis of rotation, the distance being measured along a footprint dimension line extending from the central system axis to the central axis of rotation; and each of the faces of each of the load locks being spaced from the central axis of rotation by a wafer feed distance and each respective face being positioned relative to the footprint dimension line at an acute angle, the wafer feed distances of the respective faces having values equal to each other, the acute angles of the respective faces having the same value, the positioning of the faces relative to each other being at a nest angle, the value of the nest angle being about twice the value of the acute angle.

9. An atmospheric transport module as recited in claim 8, further comprising:

the value of each of the acute angles is about forty-five degrees; and the value of the nest angle is about ninety degrees.

10. An atmospheric transport module as recited in claim 7, further comprising:

the front end robot comprising:
a base mounted for theta rotation on a central axis of rotation;
the end effector being mounted on the base and having an extend movement to transfer a wafer; and
a drive for separately providing the theta rotation and the extend movement of the respective base and end effector;

each of the respective faces of each of the load locks being spaced from the central axis of rotation by a wafer feed distance, each wafer feed distance being measured along a wafer feed line extending from the central axis of rotation perpendicular to the respective face, the wafer feed distances being equal;

each respective face being positioned relative to the footprint dimension line at an acute angle, the acute angles having the same value; and with the respective faces at the respective acute angles, the drive being effective to cause the extend movement of the end effector to be along the respective wafer feed line to position a wafer in the respective load lock without the theta rotation of the base.

11. An atmospheric transport module as recited in claim 7, further comprising:

the front end robot having a central axis of rotation;

the footprint of the system being proportional to a distance between the central system axis and the central axis of rotation, the distance being measured along a footprint dimension line extending from the central system axis to the central axis of rotation;

the nest defined by the faces being a generally triangular area extending on opposite sides of the footprint dimension line; and the portion of the front end robot comprising the end effector.

12. An atmospheric transport module as recited in claim 7, further comprising:

the front end robot having a central axis of rotation;

the footprint of the system being proportional to a distance between the central system axis and the central axis of rotation, the distance being measured along a footprint dimension line extending from the central system axis to the central axis of rotation; and the relative positioning of the faces comprising each of the faces being oriented at an acute angle relative to the footprint dimension line and at a given wafer feed distance from the central axis of rotation, so that the value of the given wafer feed distance as projected onto the footprint dimension line is less than the value of the entire given wafer feed distance, such that the value of the footprint dimension line is minimized.

13. An atmospheric transport module as recited in claim 7, further comprising:

each face being perpendicular to a wafer receiving axis along which a wafer is received by the respective port; and the front end robot having a base mounted on an axis of rotation, the robot being provided with arms supporting the end effector for movement along a linear path coinciding with the wafer receiving axis when the base is stationary on the axis of rotation, the axis of rotation intersecting the wafer receiving axis so that a component of the wafer transfer distance is less than the wafer transfer distance and so that when the end effector is aligned with the wafer receiving axis the end effector is movable along the linear path through the load lock port without rotation of the base on the axis of rotation to supply a wafer to the load lock.

14. An atmospheric transport module as recited in claim 7, further comprising:

the load locks being on one side of the front end robot;

a wafer supply axis extending perpendicular to each face, the wafer supply axes intersecting at a common point;

at least two wafer cassettes mounted on a second side of the front end robot, the second side being opposite to the one side for supplying wafers to the end effector;

the front end robot having a base mounted for rotation on a robot axis, the robot axis extending through the common point and being at a fixed position between the one side and the second side; and a drive for rotating the base on the robot axis to position the end effector to receive a wafer from one of the cassettes and to position the end effector aligned with the wafer support axis, the drive moving the end effector along the wafer supply axis with the base stationary on the robot axis to supply a wafer to one of the load locks.

15. Apparatus for transferring a semiconductor wafer, comprising:

a central vacuum transport module containing a central wafer transport robot mounted for rotation on a central vacuum transport module axis, the central vacuum transport module having first and second wafer transfer ports through which the central wafer transport robot extends to transport a wafer to or from the central vacuum transport module;

an atmospheric transport module having an atmospheric wafer transport robot mounted for rotation on an atmospheric transport module axis, the atmospheric wafer transport robot having a minimum wafer transfer distance extending from the atmospheric transport module axis;

a first load lock having a first atmospheric port and a first vacuum port, the first vacuum port being configured to allow transfer of a wafer by the wafer transport robot to and from the central vacuum transport module;

a second load lock having a second atmospheric port and a second vacuum port, the second vacuum port being configured to allow transfer of a wafer by the wafer transport robot to and from the central vacuum transport module;

the first and second load locks being positioned on opposite respective sides of a first footprint axis along which a footprint dimension of the apparatus is measured;

the central atmospheric transport module and the central vacuum transport module being positioned relative to each other so that each of the atmospheric transport module axis and the central vacuum transport module axis is intersected by the first footprint axis, and so that the atmospheric transport module is adjacent to the first and second atmospheric ports of the respective load locks and the central vacuum transport module is adjacent to the first and second vacuum ports of the respective load locks;

each of the respective first and second atmospheric ports of the respective first and second load locks being positioned at an acute angle with respect to the first footprint axis to define a load lock nest; and the atmospheric wafer transfer robot being operable to transfer a wafer into the respective first or second load locks via the respective first or second atmospheric ports, during the wafer transfer the minimum wafer transfer distance of the atmospheric wafer transport robot extending from the atmospheric transport module axis at an acute angle with respect to the first footprint axis to reduce the value of the footprint dimension along the first footprint axis.

* * * * *